(12) United States Patent
Kim et al.

(10) Patent No.: US 8,413,011 B2
(45) Date of Patent: Apr. 2, 2013

(54) DEVICE AND METHOD PROVIDING 1-BIT ERROR CORRECTION

(75) Inventors: Yong June Kim, Seoul (KR); Jae Hong Kim, Seoul (KR); Jun Jin Kong, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 605 days.

(21) Appl. No.: 12/651,586

(22) Filed: Jan. 4, 2010

(65) Prior Publication Data
US 2010/0174966 A1    Jul. 8, 2010

(30) Foreign Application Priority Data
Jan. 2, 2009 (KR) .................. 10-2009-0000099

(51) Int. Cl.
*H03M 13/00* (2006.01)
(52) U.S. Cl. ....................................... 714/758
(58) Field of Classification Search ............ 714/758
See application file for complete search history.

(56) References Cited

U.S. PATENT DOCUMENTS

| | | | |
|---|---|---|---|
| 7,398,453 | B2 | 7/2008 | Yu |
| 2006/0190797 | A1* | 8/2006 | Xin ............................ 714/758 |
| 2007/0226586 | A1 | 9/2007 | Park et al. |
| 2008/0052594 | A1* | 2/2008 | Yedidia et al. ............. 714/758 |
| 2010/0042897 | A1* | 2/2010 | Han et al. ................... 714/752 |
| 2011/0010600 | A1* | 1/2011 | Gong et al. ................. 714/752 |

FOREIGN PATENT DOCUMENTS

| | | |
|---|---|---|
| JP | 2008167357 A | 7/2008 |
| KR | 1020070084951 A | 8/2007 |
| KR | 1020080053346 A | 6/2008 |

* cited by examiner

*Primary Examiner* — Scott Baderman
*Assistant Examiner* — Neil Miles
(74) *Attorney, Agent, or Firm* — Volentine & Whitt, PLLC (57) ABSTRACT

A 1-bit error correction method is provided. In the method, a variable node at which an error has occurred is detected based on a number of unsatisfied check nodes that do not satisfy a parity condition among check nodes connected to each of variable nodes and an error in a bit corresponding to the detected variable node is corrected.

5 Claims, 9 Drawing Sheets

DEVICE AND METHOD PROVIDING 1-BIT ERROR CORRECTION

CROSS-REFERENCE TO RELATED APPLICATION

This application claims priority under 35 U.S.C. §119 to Korean Patent Application No. 10-2009-0000099 filed on Jan. 2, 2009, the subject matter of which is hereby incorporated by reference.

BACKGROUND

The present inventive concept relates to semiconductor devices, and more particularly, to 1-bit error correction methods and devices capable of quickly finding and correcting an error when the error occurs in a single bit during error correction code (ECC) decoding.

As the data storage and data access bandwidth of semiconductor devices has increased, the incorporation of error correction circuits adapted to the detection and correction of data error(s) has become increasingly common. Data errors are often caused by malfunctioning or defective memory cells. The error correction circuits commonly used in contemporary semiconductor devices include certain error correction circuits using memory cell redundancy and other error correction circuit using ECC capabilities.

A semiconductor memory device including an error correction circuit using memory cell redundancy must provide normal memory cells and redundant memory cells. In operation, this type of semiconductor memory device essentially replaces a defective memory cell with a redundant memory cell during read/write operations. Error correction circuits using redundant memory cells are typically used in dynamic random access memory (DRAM) devices.

Alternately, other semiconductor memory devices including an error correction circuit using ECC capabilities generates and stores parity data (or syndrome data) along with the "payload" data to be stored in memory. Subsequent detection and correction of error(s) in read data obtained from the semiconductor memory device is enabled by the presence of the parity or syndrome data. This type of error correction circuit using ECC capabilities is more commonly associated with read-only memory (ROM) devices, and especially flash memory devices.

Unfortunately, when ECC is used to detect and correct errors in very small quantities of data, the computational overhead and hardware complexity required to provide such capabilities may be unnecessarily (or disproportionately) high. In particular, when a resistance variation (or threshold voltage distribution) does not shift but remains relatively stable within electrically programmable read only memories, including flash memory, the probability of a bit error is typically very low. That is, the likelihood of bit errors (and particularly bit errors exceeding single bit error) occurring in read data obtained from these types of semiconductor memory devices is often insufficient to justify the expense and added complexity required to implement conventional ECC capabilities which are typically ascribed to systems exhibiting a higher incidence of bit errors and particularly multi-bit errors.

SUMMARY

Embodiments of the inventive concept provide a 1-bit error correction method and device within semiconductor memory devices that may be realized in relatively simple computational hardware and/or limited software resources.

According to some embodiments of the present invention, there is provided a 1-bit error correction method including calculating a number of unsatisfied check nodes that do not satisfy a parity condition among check nodes connected to each of variable nodes, determining whether the peak of unsatisfied check nodes calculated with respect to the respective variable nodes exceeds a predetermined value, and performing error decoding of a bit corresponding to a variable node with respect to which the peak of unsatisfied check nodes has been calculated when the peak number of unsatisfied check nodes exceeds the predetermined value. The performing the error decoding of the bit may include performing bit flipping on the bit corresponding to the variable node with respect to which the peak number of unsatisfied check nodes has been calculated.

The method may further include detecting a position of a first or last one of the variable nodes connected to the unsatisfied check nodes when the peak number of unsatisfied check nodes does not exceed the predetermined value.

The method may further include estimating that an error has occurred at a variable node positioned "k" places after the first variable node among the variable nodes connected to the unsatisfied check nodes or estimating that an error has occurred at a variable node positioned "k" places before the last variable node among the variable nodes connected to the unsatisfied check nodes, where "k" may denote a message size in a parity-check matrix.

The method may further include performing error decoding of a bit corresponding to the variable node at which it is estimated that the error has occurred.

According to other embodiments of the present invention, there is provided a 1-bit error correction device including a computation unit configured to calculate a number of unsatisfied check nodes that do not satisfy a parity condition among check nodes connected to each of variable nodes, a control unit configured to determine whether a peak of unsatisfied check nodes calculated by the computation unit exceeds a predetermined value, and an error correction unit configured to perform error correction of a bit corresponding to a variable node with respect to which the peak of unsatisfied check nodes has been calculated when the peak number of unsatisfied check nodes exceeds the predetermined value.

The control unit may detect a position of a first or last one of the variable nodes connected to the unsatisfied check nodes when the peak of unsatisfied check nodes does not exceed the predetermined value and the error correction unit may perform error correction based on the detected position of the first or last variable node.

The error correction unit may correct an error in a bit corresponding to a variable node positioned "k" places after the first variable node among the variable nodes connected to the unsatisfied check nodes or may correct an error in a bit corresponding to a variable node positioned "k" places before the last variable node among the variable nodes connected to the unsatisfied check nodes, where "k" may denote a message size in a parity-check matrix.

The error correction unit may perform bit flipping on a bit corresponding to a variable node at which an error has occurred.

BRIEF DESCRIPTION OF THE DRAWINGS

The above and other features and advantages of the inventive concept will become more apparent upon considering certain embodiments thereof described with reference to the attached drawings in which.

DETAILED DESCRIPTION OF THE EMBODIMENTS

Embodiments of the inventive concept now will be described in some additional detail with reference to the accompanying drawings. The inventive concept may, however, be embodied in many different forms and should not be construed as being limited to only the illustrated embodiments. Rather, the embodiments are presented as teaching examples. Throughout the written description and drawings, like numbers and labels are used to indicate like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1A:
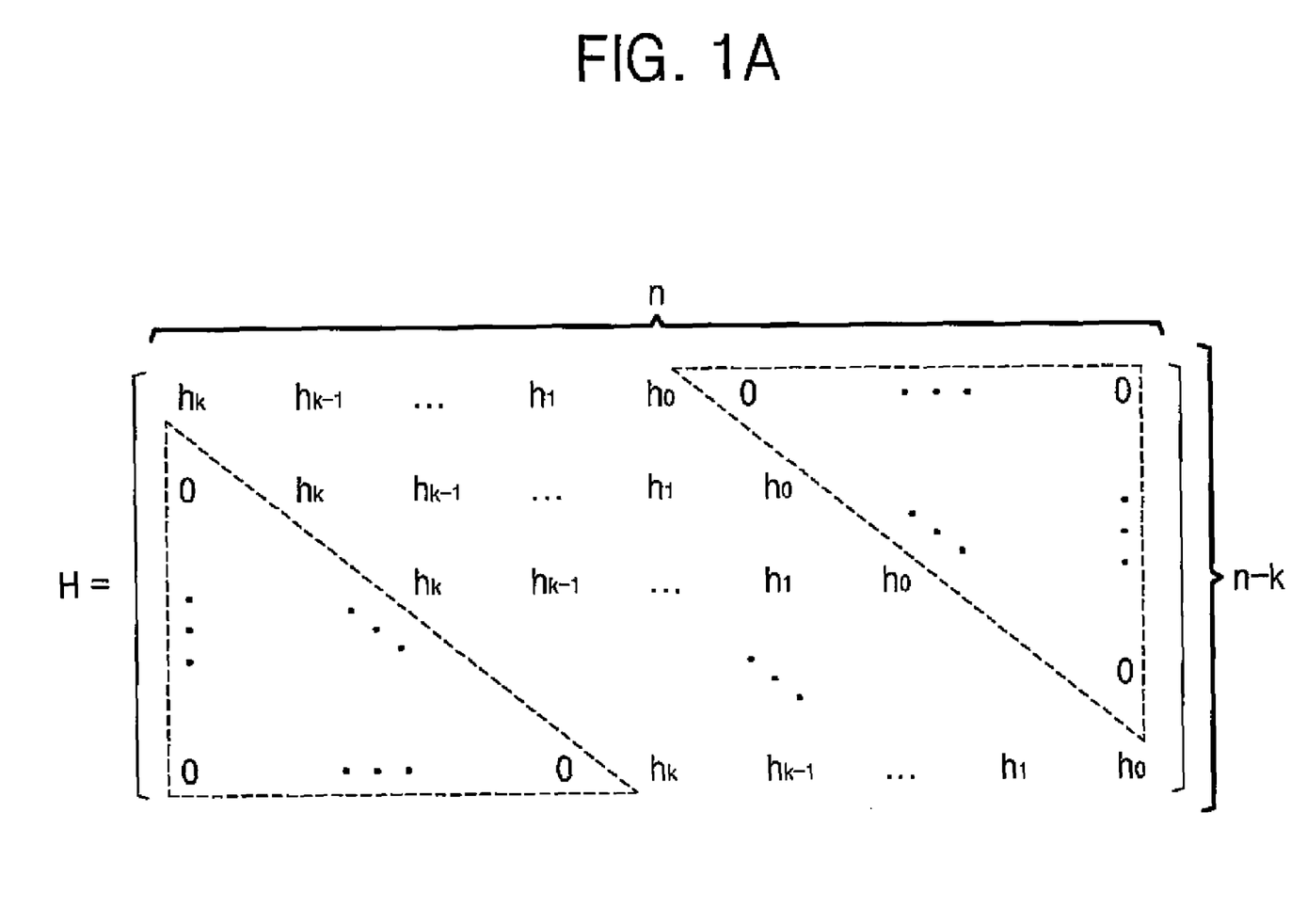
FIG. 1A is a diagram of a parity-check matrix for a cyclic code according to an embodiment of the inventive concept.

FIG. 1A is a diagram of a parity-check matrix "H" for a cyclic code according to an embodiment of the inventive concept. The cyclic code may be a Bose-Chaudhuri-Hocquenghem (BCH) code, a Reed-Solomon (RS) code, or a Hamming code.

The illustrated parity-check matrix H is a matrix representing the parity check of a linear code and includes elements $h_k$ through $h_0$ having values based on the characteristic of an error correction code (ECC). A codeword vector used to detect and correct an error together with the parity-check matrix H may include at least one item of message information and at least one parity bit.

Assuming that the codeword vector is denoted by c, it may be determined that no error has occurred when a condition of $H \cdot c^T = 0$ is satisfied and it may be determined that an error has occurred when the condition is not satisfied. For instance, when an error has occurred in a codeword r, the receive codeword r may be expressed by $r = c + e$. As is seen from an equation of $[H \cdot r^T = H \cdot (c+e)^T = H \cdot e^T \neq 0]$, a check node value may not be 0 when an error has occurred. Here, T may indicate transposition. In addition, row vectors (e.g., $\{h_k, h_{k-1}, \ldots, h_1, h_0, 0, \ldots, 0\}$, $\{0, h_k, h_{k-1}, \ldots, h_1, h_0, 0, \ldots, 0\}$, ..., and $\{0, \ldots, 0, h_k, h_{k-1}, \ldots, h_1, h_0\}$) in the parity-check matrix H may be linearly independent of one another.

With respect to the parity-check matrix H for a cyclic code illustrated in FIG. 1A, the size of a codeword is denoted by "n" and the size of a message is denoted by "k". A matrix multiplied by a message vector to generate a codeword vector is referred to as a generator matrix. A polynomial corresponding to the generator matrix is referred to as a generator polynomial, e.g., g(x). After the generator polynomial is determined, a parity-check polynomial is determined. In detail, the parity-check polynomial is determined such that the product of the generator polynomial and the parity-check polynomial is $x^n + 1$ and may be represented by h(x). For instance, h(x) may be $h_0 + h_1 x + h_2 x^2 + \ldots + h_k x^k$ and coefficients of respective orders may be elements in a row of the parity-check matrix H. Here, the coefficients $h_0$ through $h_k$ of the respective orders may be "0" or "1" and the coefficient $h_k$ of the highest order and the constant $h_0$ in the parity-check polynomial h(x) may always be "1".

As is illustrated in FIG. 1A, in the parity-check matrix H for a cyclic code, elements $[h_k \sim h_0]$ are arranged in each row and shifted by 1 place in the next row and the other elements may be all "0". In addition, since the parity-check matrix H for the cyclic code is a dense matrix, the number of 0s and the number of 1s may be almost the same in the elements $[h_k \sim h_0]$. As described above, the elements $h_0$ and $h_k$ may be "1". Based on these features, an error can be easily estimated and corrected when the error has occurred in only one bit during error correction using an ECC.

Figure 1B:
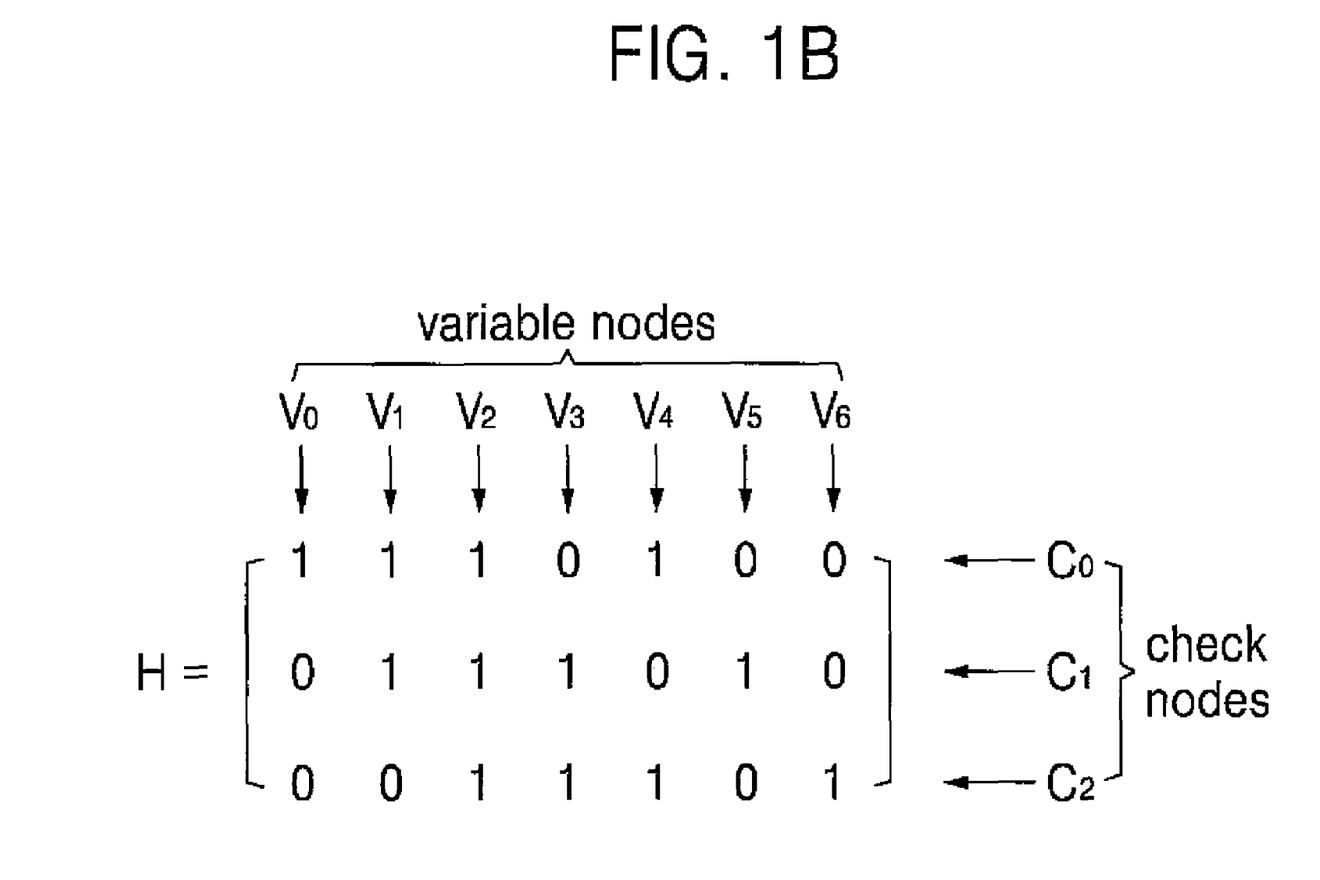
FIG. 1B is a diagram illustrating a variable node and a check node in a cyclic code according to an embodiment of the inventive concept.

FIG. 1B is a diagram for explaining a variable node and a check node in a cyclic code according to some embodiments of the present inventive concept. Referring to FIGS. 1A and 1B, n=7, k=4, and $[h_k \sim h_0] = [1\ 1\ 1\ 0\ 1]$ with respect to a parity-check matrix H illustrated in FIG. 1B. The parity-check matrix H may be expressed by a parity check polynomial [$h(x)=x^4+x^3+x^2+1$]. Accordingly, seven variable nodes $V_0, V_1, \ldots,$ and $V_6$ and three check nodes $C_0, C_1,$ and $C_2$ exist. The check nodes are used to estimate a variable node having an error. When the parity-check matrix H is determined, (n−k) check nodes are defined.

For instance, when an error occurs at the variable node $V_0$, one check node, i.e., $C_0$ does not satisfy a parity condition. When an error occurs at the variable node $V_1$, two check nodes i.e., $C_0$ and $C_1$ do not satisfy the parity condition. When an error occurs at the variable node $V_2$, three check nodes i.e., $C_0, C_1,$ and $C_2$ do not satisfy the parity condition.

Figure 2:
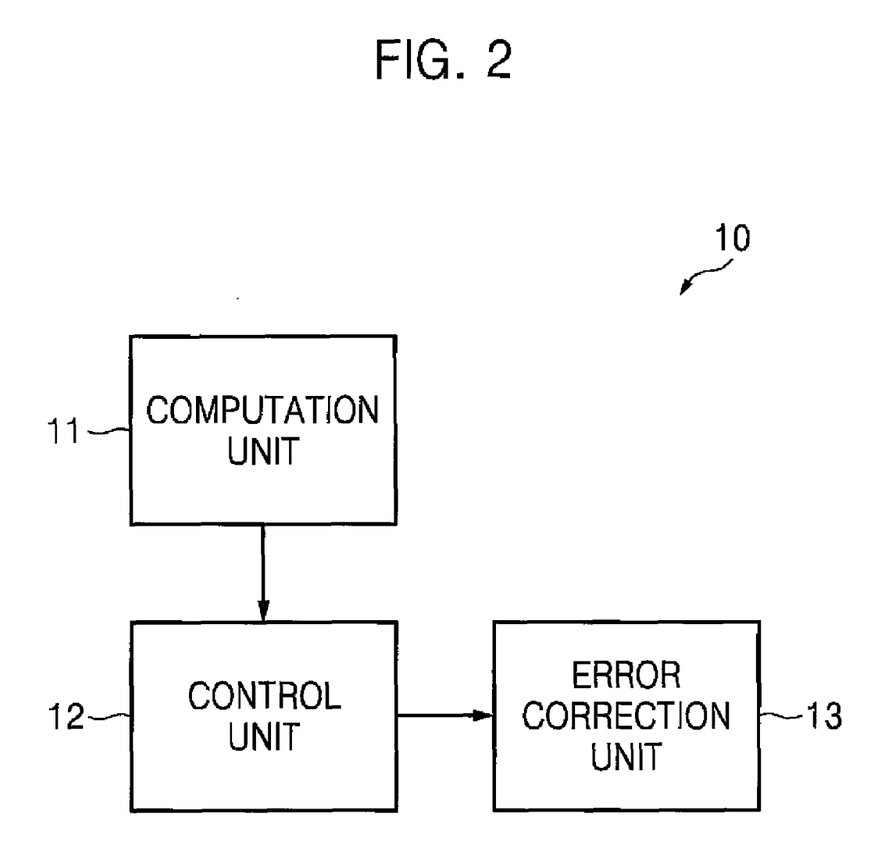
FIG. 2 is a general block diagram of a 1-bit error correction device according to an embodiment of the inventive concept.

FIG. 2 is a general block diagram of a 1-bit error correction device 10 according to an embodiment of the inventive concept. The 1-bit error correction device 10 comprises a computation unit 11, a control unit 12, and an error correction unit 13.

The computation unit 11 calculates a number of check nodes (hereinafter, referred to as "unsatisfied check nodes") that do not satisfy the parity condition, that is, check nodes that do not have a value of "0" among check nodes connected to a variable node. An error component in a received codeword may change (or make) a value of the check node into a value that does not satisfy the parity condition and an error correction method presumes that an error occurs in only one bit in the current embodiments of the present inventive concept, and therefore, the amount of computation performed by the computation unit 11 remarkably decreases as compared to conventional methods.

The control unit 12 determines whether the maximum number of unsatisfied check nodes computed by the computation unit 11 exceeds a predetermined value. In detail, the computation unit 11 calculates the number of unsatisfied check nodes among the check nodes connected to each of a plurality of variable nodes and outputs the numbers of unsatisfied check nodes for the plurality of variable nodes, respectively. The control unit 12 detects a maximum number (or "peak") for the computed numbers. A method of estimating a position of a variable node having an error based on the peak of unsatisfied check nodes will be described with reference to FIGS. 3 through 5 hereafter. The predetermined value may be defined in relation to a number of factors including codeword size (or length), message size (length), or a particular application.

The error correction unit 13 performs error correction on a bit which the control unit 12 estimates that an error has occurred in. For instance, the error correction unit 13 may perform bit flipping on a bit corresponding to a variable node having an error. Bit flipping is a conventionally understood process of inverting a bit (e.g., from 0 to 1, or from 1 to 0), and a detailed description of this process is omitted, accordingly.

Figure 3:
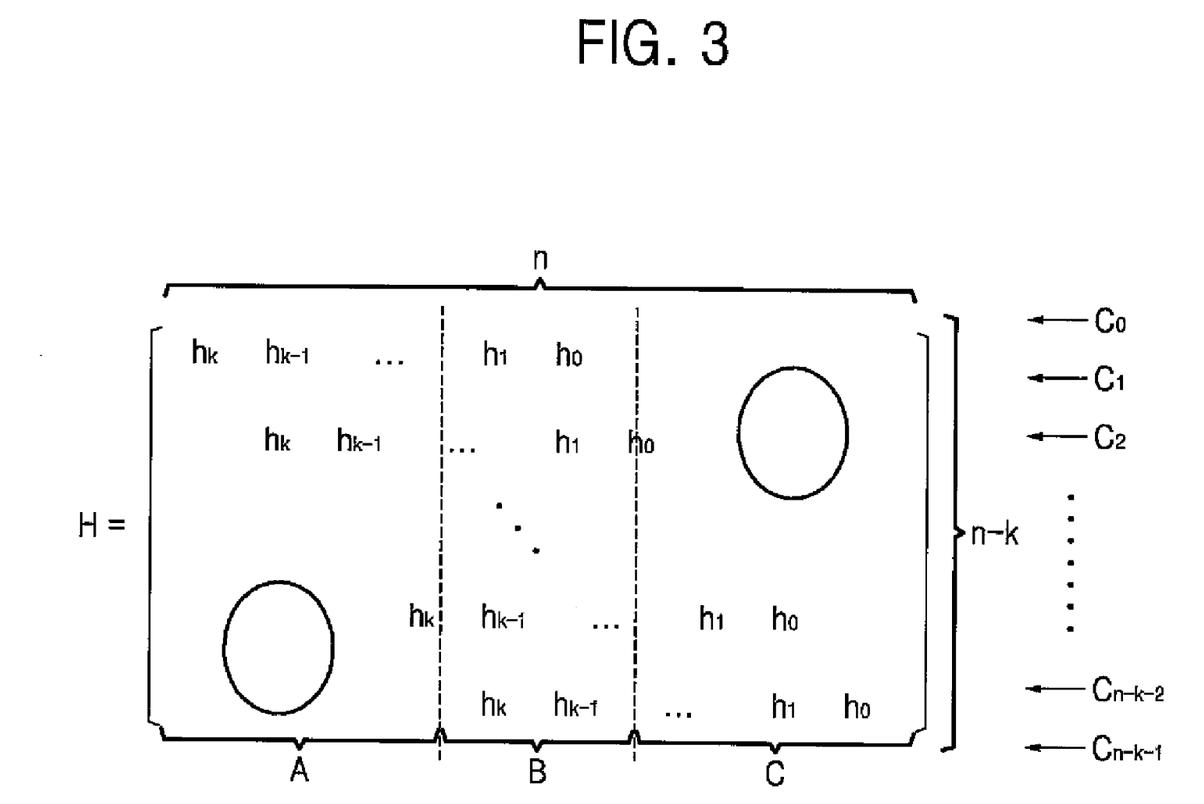
FIG. 3 is a diagram illustrating regions in which an error may occur in a parity-check matrix according to an embodiment of the inventive concept.

FIG. 3 is a diagram illustrating regions (hereinafter, referred to as "potential error regions") in which an error may occur in a parity-check matrix H according to certain embodiments of the inventive concept. Referring to FIGS. 1 through 3, the exemplary parity-check matrix H is divided into three potential error regions A, B, and C. The region B includes only elements [$h_k$~$h_0$] and the regions A and C partially include the elements [$h_k$~$h_0$].

A first case where a 1-bit error occurs in the region B will be described. Since the parity-check matrix H for a cyclic code is a dense matrix, the number of 0s and the number of 1s may be almost the same in the elements [$h_k$~$h_0$]. Accordingly, when an error occurs in a bit in the region B, the number of check nodes connected to variable nodes having the error is (n−k)/2 and the number of unsatisfied check nodes connected to the variable nodes are also (n−k)/2.

In addition, since the number of 0's or 1's in a column corresponding to a variable node having no errors is half of the number of elements in the column, the number of unsatisfied check nodes connected to variable nodes other than the variable nodes having the error is about {(n−k)/4=[(n−k)/2]× ½}. Accordingly, when the error occurs in the region B, the number of unsatisfied check nodes connected to the variable nodes having the error is the peak. At this time, the control unit 12 determines whether the peak exceeds a predetermined value. When the peak exceeds the predetermined value, the error correction unit 13 corrects the error in a bit corresponding to the variable node using, for example, bit flipping.

The predetermined value (e.g., "δ") may vary with different embodiments of the inventive concept. For instance, to distinguish the peak (e.g., about (n−k)/2) of unsatisfied check nodes from the lower number (e.g., about (n−k)/4) of unsatisfied check nodes, the predetermined value δ may range between about (n−k)/4<δ<(n−k)/2.

Figure 4A:
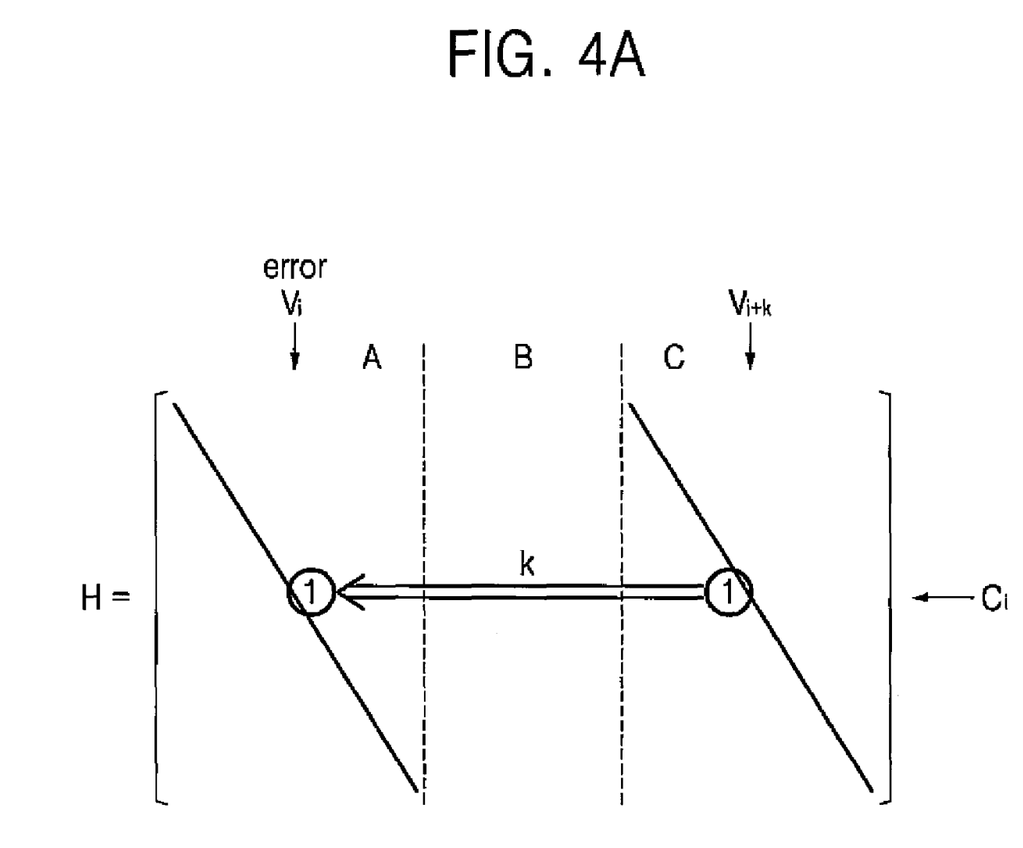
FIG. 4A is a conceptual diagram illustrating the estimation of a position for a variable node having an error when the error occurs in region A according to an embodiment of the inventive concept.
Figure 4B:
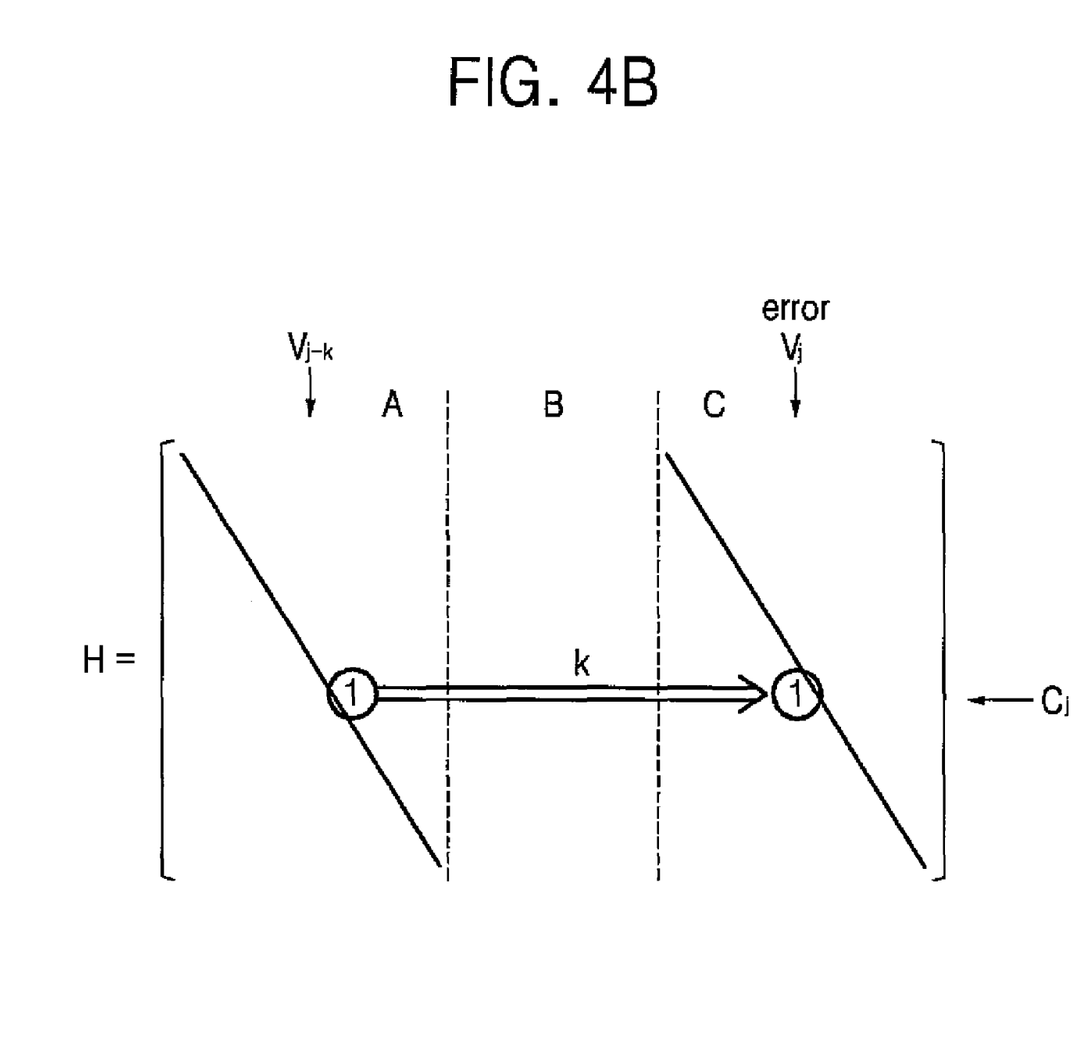
FIG. 4B is another conceptual diagram illustrating the estimation of a position of a variable node having an error when the error occurs in region B according to an embodiment of the inventive concept.

FIGS. 4A and 4B are conceptual diagrams illustrating the estimation of a position of a variable node having an error when the error occurs in the regions A and C, respectively, according to certain embodiments of the inventive concept. When the peak of unsatisfied check nodes does not exceed the predetermined value δ, it may be estimated that a 1-bit error has occurred in the region A or C. FIG. 4A illustrates the estimation of a variable node having the error when the error occurs in the region A. FIG. 4B illustrates the estimation of a variable node having the error when the error occurs in the region C.

Error correction for the 1-bit error occurring in the region A will be described with reference to FIGS. 1A through 4A. As illustrated in FIG. 4A, when the error occurs in an $i^{th}$ variable node $V_i$, the control unit 12 detects an index of a variable node $V_{i+k}$ corresponding to the last one of variable nodes connected to an unsatisfied check node $C_i$ and estimates that the error has occurred at a variable node positioned "k" places before the detected index of the last variable node $V_{i+k}$.

In some additional detail, when an index indicating the position of the last variable node among variable nodes connected to an unsatisfied check node is greater than "k" and less than "a", as determined based on δ, it may be estimated that the 1-bit error has occurred in the region A and the above-described error correction is performed. This error correction is performed based on the characteristic that the elements $h_0$ and $h_k$ among the elements [$h_k$~$h_0$] repeatedly arranged in the parity-check matrix H always have a value of "1".

Referring to FIGS. 1A through 4B, error correction for the 1-bit error occurring in the region C will now be described. As illustrated in FIG. 4B, when the error occurs in a $j^{th}$ variable node $V_j$, the control unit 12 detects an index of a variable node $V_{i-k}$ corresponding to the first one of variable nodes connected to an unsatisfied check node $C_j$ and estimates that the error has occurred at a variable node positioned "k" places after the detected index of the first variable node $V_{i-k}$.

In some additional detail, when an index indicating the position of the first variable node among variable nodes connected to an unsatisfied check node is greater than "b", as determined based on δ, and less than "n−k", it may be estimated that the 1-bit error has occurred in the region C and the above-described error correction is performed. This error correction is also performed based on the characteristic that the elements $h_0$ and $h_k$ among the elements [$h_k$~$h_0$] repeatedly arranged in the parity-check matrix H always have a value of "1". As described above, the values of "a" and "b" are determined based on the value of δ and thus vary with a codeword size (or length), a message size (or length), or an application.

Figure 5:
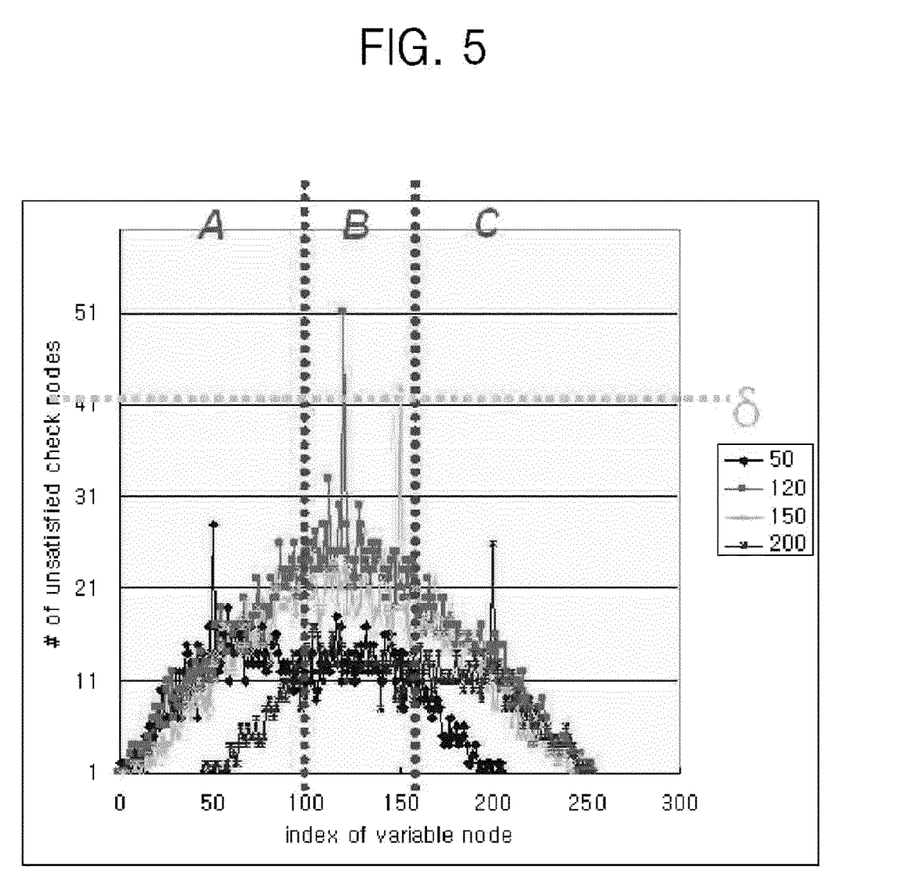
FIG. 5 is a plot graph showing the number of check nodes that do not satisfy a parity condition with respect to each variable node according to certain embodiments of the inventive concept.

FIG. 5 is a plot graph of a simulation showing a number of unsatisfied check nodes that do not satisfy the parity condition with respect to each variable node in a simulation according to embodiments of the inventive concept. In the simulation, n=255, k=155, δ=41, and t=13, where "t" denotes the error correction capability of an ECC decoder. In cases $V_{120}$ and $V_{150}$ where the peak of unsatisfied check nodes connected to a variable node exceeds the predetermined value δ, it is estimated that a 1-bit error has occurred in the region B and error correction is performed on a bit corresponding to the variable node.

In cases $V_{50}$ and $V_{200}$ where the peak of unsatisfied check nodes connected to a variable node does not exceed the predetermined value δ, the error correction described with respect to FIGS. 4A and 4B is performed.

Figure 6:
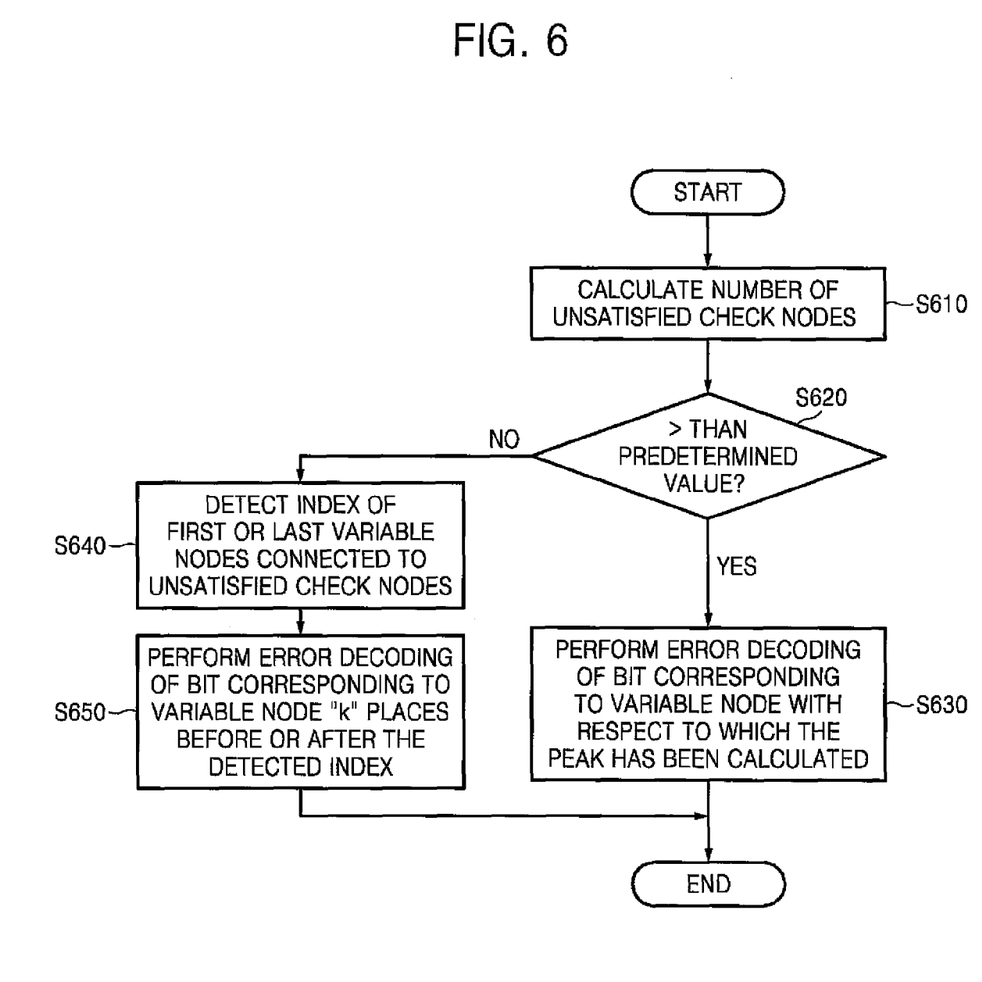
FIG. 6 is a flowchart summarizing a 1-bit error correction method according to an embodiment of the inventive concept.

FIG. 6 is a flowchart summarizing a 1-bit error correction method according to an embodiment of the inventive concept. Referring to FIGS. 2 through 6, the computation unit 11 first calculates the number of unsatisfied check nodes (i.e., check nodes that do not have a value of "0") connected to each of the variable nodes (S610). The control unit 12 then determines whether a peak of the unsatisfied check nodes calculated with respect to the respective variable nodes exceeds a predetermined value (S620).

When the peak of unsatisfied check nodes exceeds the predetermined value, it is estimated that an error has occurred in the region B (S620=YES). The error correction unit 13 performs error decoding of a bit corresponding to a variable node with respect to which the peak of unsatisfied check nodes has been calculated (S630).

However, when the peak of unsatisfied check nodes does not exceed the predetermined value, it is estimated that an error has occurred in the region A or C (S620=NO). The control unit 12 then detects an index of the first or last one of the variable nodes connected to the unsatisfied check nodes (S640). The error correction unit 13 then performs error decoding of a bit corresponding to a variable node positioned "k" places before or after the detected index of the last or first variable node (S650).

Figure 7:
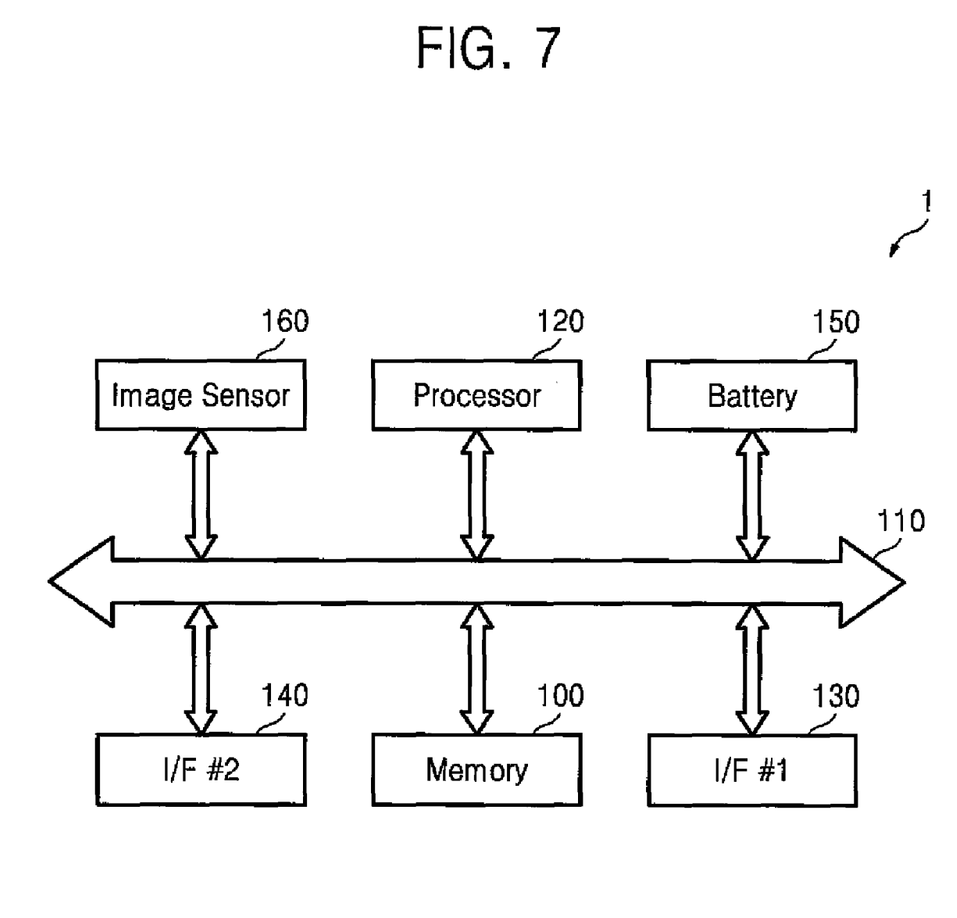
FIG. 7 is a general block diagram of a memory system capable of incorporating a memory device according to embodiments of the inventive concept.

FIG. 7 is a schematic block diagram of a memory system 1 capable of incorporating a memory device according to various embodiments of the inventive concept. Referring to FIG. 7, the memory system 1 comprises the memory device 100 and a processor 120 connected via a system bus 110. The memory device 100 incorporates a 1-bit error correction device according to an embodiment of the inventive concept, or is capable of performing a 1-bit error detection and correction method according to an embodiment of the inventive concept.

The processor 120 generates control signals capable of controlling program (or write), read and/or verify operations within the memory device 100. Accordingly, a control block (not shown) included in the memory system 1 may perform the program (or write) operation, the read operation, or the verify operation in response to a control signal output from the processor 120.

A 1-bit error correction method according to some embodiments of the inventive concept may be written as program commands to a computer readable recording medium which may include a program command, a data file, a data structure, and so on individually or combinations thereof. Examples of the computer readable recording medium include magnetic media (such as hard disks, floppy disks, and magnetic tapes), optical media (such as CD-ROMs and DVDs), magneto-optical media (such as floptical disks), and hardware devices (such as ROM, random access memory (RAM), PRAM, RRAM, FRAM, and flash memory) specially configured to store and perform program commands. Examples of a program command include high-level codes that can be executed on a computer using an interpreter as well as machine codes made by a compiler. The above-mentioned hardware devices may be configured to operate as at least one software module or vice versa in order to perform operations according to some embodiments of the present inventive concept.

When the memory system 1 is embodied as a portable application, the memory system 1 may also include a battery 150 to supply operating power to the memory device 100 and the processor 120. The portable application may be a portable computer, a digital camera, a personal digital assistant (PDA), a cellular telephone, an MP3 player, a portable multimedia player (PMP), an automotive navigation system, a memory card, a system card, a game console, an electronic dictionary, or a solid state disk.

The memory system 1 may also include an interface 130, e.g., an input/output unit, to communicate data with an external data processing device. When the memory system 1 is a wireless system, the memory system 1 may also include a wireless interface 140 which may be connected to the processor 120 and communicate data with an external wireless device through the system bus 110 via a wireless connection. The wireless system may be a wireless device such as PDA, a portable computer, a wireless telephone, a pager, or a digital camera; a radio frequency identification (RFID) reader; or an RFID system. The wireless system may also a wireless local area network (WLAN) system or a wireless personal area network (WPAN) system. Moreover, the wireless system may be a cellular network.

When the memory system 1 is an image pick-up device, the memory system 1 may also include an image sensor 160 converting an optical signal into an electrical signal. The image sensor 160 may be an image sensor using a charge coupled device (CCD) or a complementary metal-oxide semiconductor (CMOS) image sensor. At this time, the memory system 1 may be a digital camera, a cellular telephone equipped with a digital camera, or a satellite system equipped with a camera.

An error correction method according to embodiments of the inventive concept enables a 1-bit error to be easily corrected using a relatively a small amount of computation resources. In addition, an error correction device according to embodiments of the inventive concept may be readily implemented using circuitry and software of relatively low complexity.

While the present inventive concept has been particularly shown and described with reference to exemplary embodiments thereof, it will be understood by those of ordinary skill in the art that various changes in forms and details may be made therein without departing from the scope of the inventive concept as defined by the following claims.

What is claimed is:

1. A 1-bit error correction method comprising:
    calculating a number of unsatisfied check nodes that do not satisfy a parity condition among check nodes connected to each of variable nodes;
    determining whether a peak number of unsatisfied check nodes calculated with respect to the respective variable nodes exceeds a predetermined value;
    performing error decoding of a bit corresponding to a variable node with respect to which the peak number of unsatisfied check nodes has been calculated when the peak number of unsatisfied check nodes exceeds the predetermined value;

detecting a position of a first or last one of the variable nodes connected to the unsatisfied check nodes when the peak number of unsatisfied check nodes does not exceed the predetermined value; and estimating that an error has occurred at a variable node positioned "k" places after the first variable node among the variable nodes connected to the unsatisfied check nodes, or estimating that an error has occurred at a variable node positioned "k" places before the last variable node among the variable nodes connected to the unsatisfied check nodes, where "k" denotes a message size in a parity-check matrix.

2. The method of claim 1, wherein the performing the error decoding of the bit comprises performing bit flipping on the bit corresponding to the variable node with respect to which the peak number of unsatisfied check nodes has been calculated.

3. The method of claim 1, further comprising:

performing error decoding of a bit corresponding to the variable node at which it is estimated that the error has occurred.

4. A 1-bit error correction device comprising:

a computation unit configured to calculate a number of unsatisfied check nodes that do not satisfy a parity condition among check nodes connected to each of variable nodes;

a control unit configured to determine whether a peak number of unsatisfied check nodes calculated by the computation unit exceeds a predetermined value; and an error correction unit configured to perform error correction of a bit corresponding to a variable node with respect to which the peak number of unsatisfied check nodes has been calculated when the peak number of unsatisfied check nodes exceeds the predetermined value, wherein the control unit is further configured to detect a position of a first or last one of the variable nodes connected to the unsatisfied check nodes when the peak number of unsatisfied check nodes does not exceed the predetermined value and the error correction unit performs error correction based on the detected position of the first or last variable node, wherein the error correction unit is further configured to correct an error in a bit corresponding to a variable node positioned "k" places after the first variable node among the variable nodes connected to the unsatisfied check nodes or corrects an error in a bit corresponding to a variable node positioned "k" places before the last variable node among the variable nodes connected to the unsatisfied check nodes, where "k" denotes a message size in a parity-check matrix, and wherein at least one of the computation unit, the control unit and the error correction unit comprises a processor configured to respectively perform the calculation, the determination and the error correction.

5. The 1-bit error correction device of claim 4, wherein the error correction unit is further configured to perform bit flipping on a bit corresponding to a variable node at which an error has occurred.

* * * * *